Figure 1:
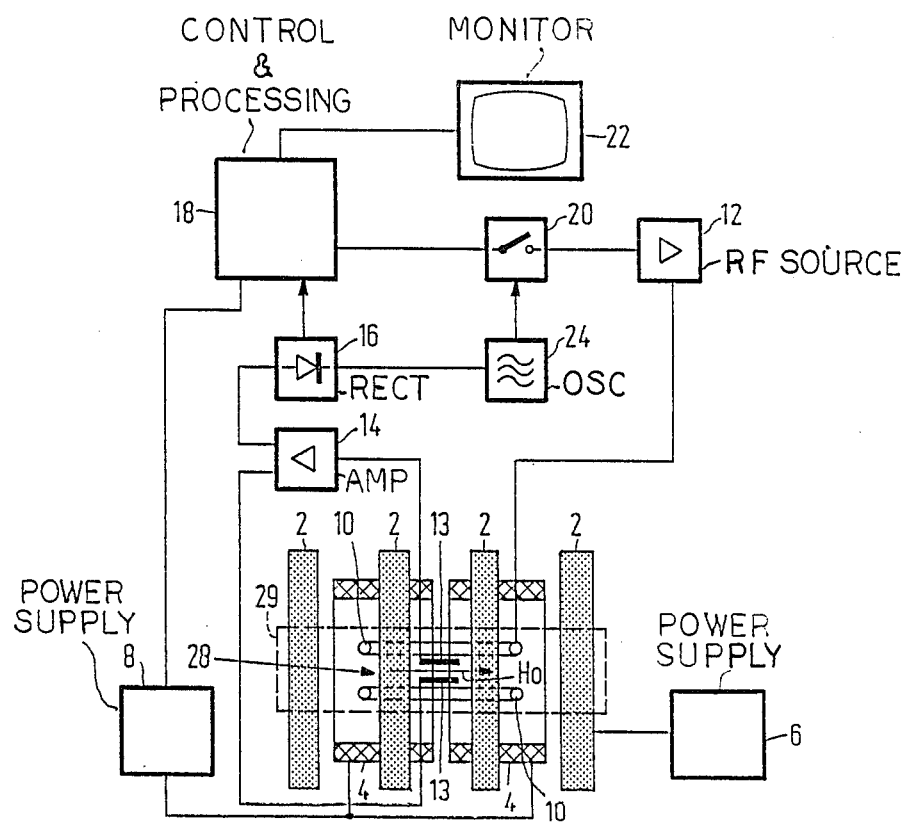

United States Patent [19]

Van Heelsbergen

[11] Patent Number: 4,777,440
[45] Date of Patent: Oct. 11, 1988

[54] MAGNETIC RESONANCE IMAGING APPARATUS IN WHICH A ROTATING FIELD IS GENERATED AND DETECTED

[75] Inventor: Teunis R. Van Heelsbergen, Eindhoven, Netherlands

[73] Assignee: U.S. Philips Corporation, New York, N.Y.

[21] Appl. No.: 59,284

[22] Filed: Jun. 8, 1987

[30] Foreign Application Priority Data

Dec. 22, 1986 [NL] Netherlands ..................... 8603253

[51] Int. Cl.⁴ ............................................. G01R 33/20
[52] U.S. Cl. .................................... 324/309; 324/322
[58] Field of Search ............... 324/300, 307, 309, 311, 324/313, 318, 322

[56] References Cited

U.S. PATENT DOCUMENTS 4,333,053  6/1982  Harrison et al. ..................... 324/309
4,361,807  11/1982  Barl et al. ............................ 324/309

*Primary Examiner*—Michael J. Tokar
*Attorney, Agent, or Firm*—Algy Tamoshunas; William J. Streeter

[57] ABSTRACT

In a magnetic resonance imaging apparatus an RF rotating field is generated by applying RF energy to two mutually perpendicular coil systems, a ¼λ lead being provided between the connection points of the systems. In that case the drive points and the detection signal output points are not the same, so that in the case of a change-over from transmission to reception, the connection between the transmitter and the receiver must be switched over. In the magnetic resonance imaging apparatus in accordance with the invention, a phase difference of 180° is created between two junctions by means of ¼λ leads so that an intermediate junction will actually not carry a voltage. This point (for transmission and reception, two different points) is connected to ground by means of a PIN diode. A simplification enables connection of the transmitter as well as the receiver to the transmitter/receiver coil system via a single coaxial cable.

10 Claims, 2 Drawing Sheets

MAGNETIC RESONANCE IMAGING APPARATUS IN WHICH A ROTATING FIELD IS GENERATED AND DETECTED

The invention relates to a magnetic resonance imaging apparatus, comprising a device for generating and detecting RF electromagnetic fields, which device comprises a transmitter/receiver with two coils and electrical connection means for generating RF magnetic fields.

A magnetic resonance imaging apparatus of this kind is known from European Patent Application No. 0,114,405. Therein, two separate coil systems are used for the transmission and reception of RF signals. In order to avoid mutual influencing between an RF transmitter coil and an RF detection coil, use must be made of an uncoupling circuit whereby, for example the circuit which includes the transmitter coil is adjusted to a substantially higher own frequency during activation of the transmitter coil. On the other hand, the transmitter coil can be short-circuited by a low-ohmic short-circuit circuit during detection by the receiver coil, so that the RF signals to be received are no longer disturbed. The book Nuclear Magnetic Resonance Imaging, published by Saunder's Company, Philadelphia, 1983, describes that the transmitter coil and the receiver coil can be combined so as to form a receiver/transmitter coil. Obviously, the described problems are thus avoided. When two mutually perpendicular coil systems are used, a rotating field can be generated. The supply terminals of these coil systems must then be connected via a $\frac{1}{4}\lambda$ lead in order to ensure that the signals are applied to each coil in the correct phase. However, the supply terminals for activation and reception of such coil systems are not the same, so that two supply terminals are required. When one terminal is connected to the transmitter, the other terminal must be uncoupled from the receiver. Similarly, when the receiver is connected to the second supply terminal, the transmitter will be uncoupled from the first supply terminal. The foregoing means that fast switching over is required. This is difficult notably when the assembly is included in a magnetic resonance imaging apparatus. Thus, standard switches cannot be used for this purpose.

It is the object of the invention to provide a magnetic resonance imaging apparatus in which RF rotating fields can be generated as well as detected by means of the same coil system, without requiring mechanical switching contacts for coupling and uncoupling supply terminals to and from the transmitter or receiver.

To achieve this, a magnetic resonance imaging apparatus in accordance with the invention is characterized in that in order to generate an RF rotating field, the magnetic fields generated by the coils extend perpendicularly to one another, a first supply terminal of a coil being connected, via a $\frac{1}{4}\lambda$ lead, to a second supply terminal whereto the other coil is connected, the first and the second supply terminal being connected, via phase-shifting connection means, to a first and a second junction, respectively, which are connected to the transmitter/receiver via connection means, the first junction being uncoupled from the second junction by means of electrical means during the transmission by the transmitter and the reception by the receiver.

Figure 2:
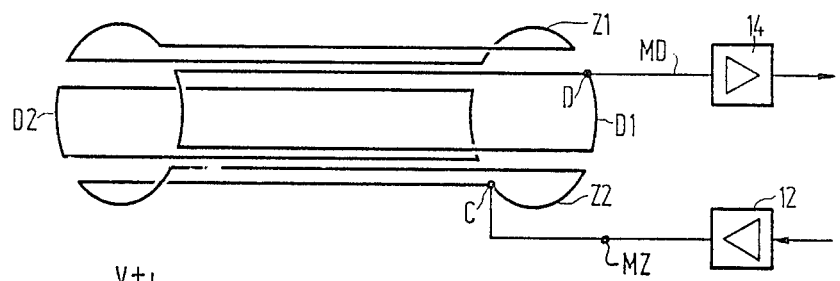
Figure 3:
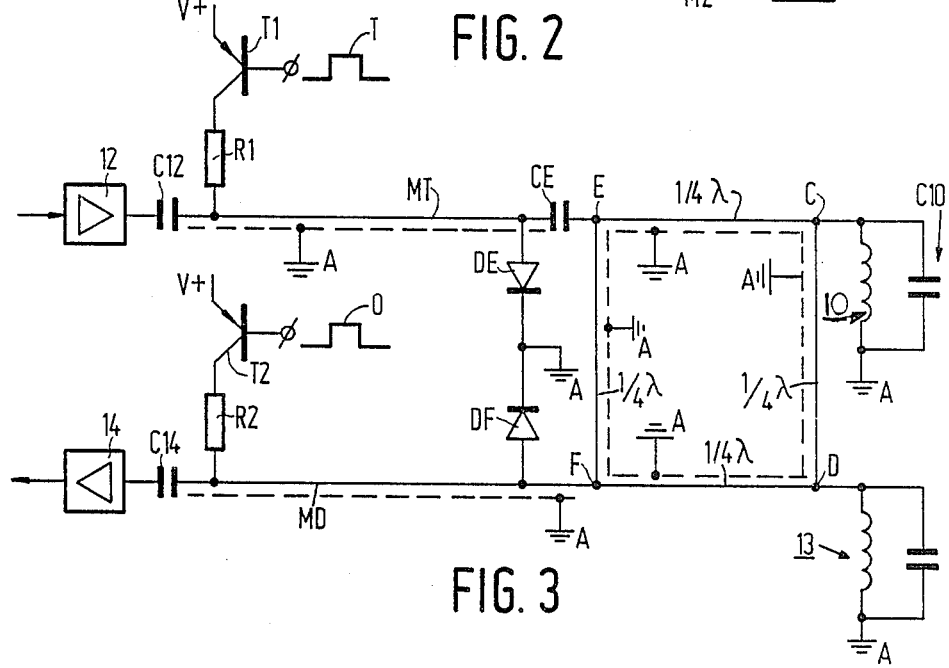
Figure 4:
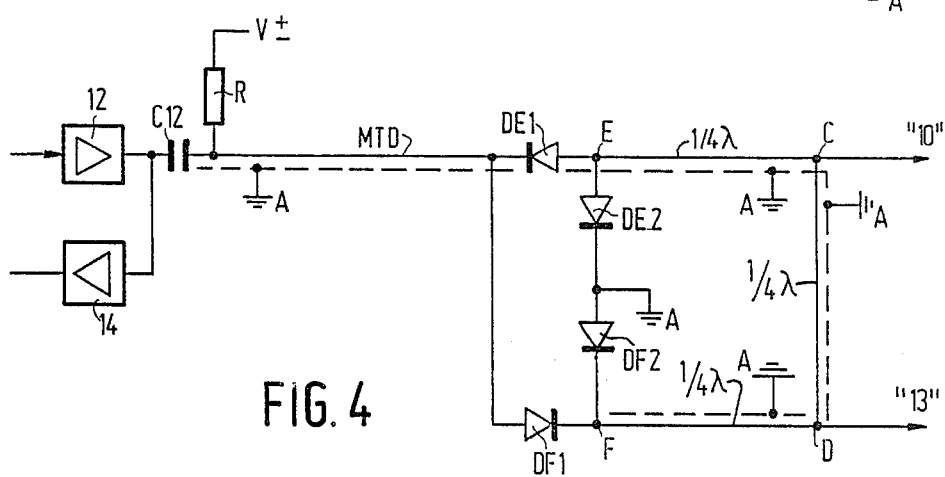

The invention will be described in detail hereinafter with respect to the accompanying diagrammatic drawing wherein:

FIG. 1 shows a magnetic resonance imaging apparatus in accordance with the invention, FIG. 2 shows a transmitter/receiver coil system, FIG. 3 shows an example of a connection of a transmitter/receiver coil system, and FIG. 4 shows a preferred connection of a transmitter/receiver coil system.

A magnetic resonance imaging apparatus as shown in FIG. 1 comprises a magnet system 2 for generating a steady, uniform magnetic field H0, a magnetic system 4 for generating magnetic gradient fields, and supply sources 6 and 8 for the magnet system 2 and the magnet system 4, respectively. A magnet coil 10 serves to generate an RF magnetic alternating field; to this end, it is connected to an RF source 12. For the detection of spin resonance signals generated in an object to be examined by the RF transmitter field there is provided a detection coil 13. For reading out, the detection coil 13 is connected to a signal amplifier 14. The signal amplifier 14 is connected to a phase-sensitive rectifier 16 which is connected to a central control and processing device 18. The central control and processing device 18 also controls a modulator 20 for the RF source 12, the supply source 8 for the gradient coils, and a monitor 22 for display. An RF oscillator 24 controls the modulator 20 as well as the phase-sensitive rectifier 16 which processes the measurement signals. The transmitter coil 10, being arranged within the magnet systems 2 and 4, encloses a measurement space 28 which is spacious enough so as to accommodate a patient in the case of an apparatus for medical diagnostic purposes. Thus, a uniform magnetic field H0, gradient fields for position selection of slices to be imaged, and a spatially uniform RF alternating field can be generated within the measurement space 28. The detection coil 13 is to be arranged within the space 28.

FIG. 2 is a perspective representation of the transmitter coil 10 and the detection coil 13 in their relative positions. For the sake of simplicity, the mutual orientation shown here will be defined as the perpendicular orientation, because the planes defined by the turns of the transmitter coil and the detection coil are substantially perpendicular in this position. The transmitter coil 10 comprises two windings Z1 and Z2 which are connected to the RF source 12. The detection coil 13 comprises two windings D1 and D2 which are connected to the signal amplifier 14. The connection means MZ and MD between the transmitter 12 and the detector 14 are customarily formed by coaxial cables which are permanently available to the transmitter 12 and the transmitter coil 10 as well as to the detector 14 and the detection coil 13, so that the transmitter coil 10 can only transmit and the detection coil 13 can only detect. Using the coil configuration shown, RF rotating fields can also be generated and detected when the supply terminals C and D are connected via a $\frac{1}{4}\lambda$ lead (coaxial cable) and switches are included in the lead MZ as well as in the lead MD. When the switch in the lead MD is open, an RF rotating field can be generated by the transmitter 12 with the aid of the four windings Z1, Z2, D1 and D2. When the switch in the lead MZ is subsequently opened and the switch in the lead MD is closed, RF rotating fields can be detected by means of the four windings Z1, Z2, D1 and D2 and the detector 14 which RF rotating fields are generated by spin resonance signals excited by the RF transmitter field. The switching over of the switches in the leads MZ and MD is experienced to be annoying, because the procedure must be carried out very quickly (ms!) and in the presence of magnetic fields (see FIG. 1).

FIG. 3 shows an embodiment in which the functions of the described switches are replaced partly by PIN diodes which are set to a blocking state or a conductive state by control voltages. The circuit shown in FIG. 3 also comprises phase-shifting connection means between the supply terminals C and D on the one side and the junctions E and F on the other side. Between the points C and E, D and F, and E and F there are arranged ¼λ leads, each of which produces a phase shift of 90° (in an ideal situation). For completeness' sake it is to be noted that the characteristic impedance of the latter three ¼λ leads amounts to half the characteristic impedance of the ¼λ lead between the points C and D. The shielding jackets of the ¼λ leads and of the connection means MT and MD are grounded at the areas denoted by the reference A in the figure.

When the transmitter 12 is active, the voltages generated at the points E and D will be opposed. The voltage at the point F will then amount to zero volts in the ideal case. The point F could be connected to ground A without disturbing the transmitter 12 or the transmitter or receiver coil 10 or 13. Similarly, when the transmitter 12 is not active, the voltages occurring upon reception (resonance signals detected by the coils 10 and 13) will produce opposed voltages at the points C and F. As a result, the point E will not carry a voltage in the ideal case. The ideal situation will be reached only if:

(a) all leads have a length of exactly ¼λ
(b) the ¼λ leads are loss-free
(c) the coils 10 and 13 have exactly the characteristic impedance of the leads
(d) the characteristic impedances of the ¼λ leads are exact.

In practice, this cannot be achieved; therefore, the junction F is connected to ground A via diode DF when the transmitter 12 is active. To this end, the base of the transistor T2 receives a control voltage $\theta$ which connects the lead MD, via a resistor R2, to a d.c. supply source V+ so that the PIN diode DF is conductive and connects the junction F to ground A. The capacitances C12 and CE are provided in order to uncouple the transmitter 12 and the diode DE, respectively, from the d.c. voltage V+. During reception, the control signal on the transistor T2 amounts to zero volts, whilst the base of the transistor T1 receives a control voltage T, so that the lead MT is connected, via a resistor R1, to the supply source V+ and the PIN diode DE connects the junction E to ground A. The transmitter 12 is uncoupled from the supply source V+ by means of the capacitance C12.

FIG. 4 shows a preferred connection of a transmitter 12/receiver 14 to a coil system 10/13 (not shown), the transmitter 12 and the receiver 14 utilizing a single connection means MTD (for example, a coaxial cable which is shielded in the same way as shown in FIG. 3). In the connection shown in FIG. 4, the ¼λ lead between the junctions E and F can be dispensed with as will be described hereinafter. The ¼λ connections between the points E and C, F and D, and C and D as well as the coil configuration 10, 13 connected to the supply terminals C and D is the same. However, the end of the cable MTD is connected on the one side to ground A via two parallel series connections of two PIN diodes each. The rectifying sense of the diodes DE1 and DF1 is opposed, like that of the diodes DE2 and DF2, none of the series connections DE1, DE2 and DF1, DF2 being conductive.

When the lead MTD is connected to a supply voltage V- via a resistor R, the diodes DE1 and DF2 will be conductive so that point F is connected to ground A. In this situation the transmitter 12 can be active. When subsequently a supply voltage V+ is applied to the resistor R, the PIN diodes DF1 and DE2 will be conductive. The junction E is then connected to ground A and the receiver 14 receives, via the cable MTD and the diode DF1 (being conductive), the resonance signals detected by the coils 10 and 13. It is to be noted that the diodes DE1, DE2, DF1 and DF2 as well as the ¼λ leads can be combined with the coils 10 and 13 so as to form one unit which can be connected to a coaxial cable (MTD) so that a transmitter/receiver coil system is obtained which can be simply exchanged.

What is claimed is:

1. A magnetic-resonance imaging apparatus, comprising a device for generating and detecting RF electromagnetic fields, which device comprises a transmitter/receiver, first and second coils, and electrical connection means therebetween, wherein the magnetic fields generated by the first and second coils extend perpendicularly to one another, a first supply terminal of said first coil being connected, via a ¼λ lead, to a second supply terminal of said second coil, the first and the second supply terminal being connected, via phase-shifting connection means, to a first and a second junction, respectively, which junctions are connected to the transmitter/receiver via electrical connection means, the first junction being uncoupled from the second junction by the electrical connection means during transmission by the transmitter and during reception by the receiver.

2. An apparatus as claimed in claim 1, wherein the phase-shifting connection means are ¼λ leads.

3. An apparatus as claimed in claim 2, wherein the characteristic impedance of the ¼λ lead between the first and the second supply terminal equals twice the characteristic impedance of the ¼λ leads between the first and the second junction and the first and the second supply terminal, respectively.

4. An apparatus as claimed in claim 1 or 2, wherein the electrical connection means comprises a ¼λ lead which connects the first junction to the second junction, the first and second junction being connected to the transmitter and the receiver, respectively.

5. An apparatus as claimed in claim 2, 3 or 4, wherein the electrical connection means comprises first and second PIN diodes, the first and second junction being connected to ground via said first and second PIN diodes which are connected in the same direction of conduction and which can be controlled via a voltage to be applied to a transmission lead from the transmitter to the first junction and a receiving lead from the second junction to the receiver, respectively.

6. An apparatus as claimed in claim 5 further comprising a first semiconductor switch and a second semiconductor switch, and wherein the transmission lead and the receiving lead are connected to a supply voltage via the first semiconductor switch and the second semiconductor switch, respectively, the first and the second semiconductor switch being conductive during reception and transmission, respectively.

7. An apparatus as claimed in claim 1, 2, or 3 further comprising first, second, third and fourth PIN diodes and wherein the first junction is connected, via the first and the second PIN diode, respectively, to the transmitter and to ground, respectively the second junction being connected to the receiver and to ground, respectively, via the third and the fourth PIN diode, respectively, the direction of conduction of the first and the third PIN diode being opposed, the direction of conduction of the second and the fourth PIN diode being opposed, the series connection of the first and the second diode as well as the series connection of the third and fourth diode not being conductive.

8. An apparatus as claimed in claim 7, wherein the first and the second junction are connected, via the first and the third PIN diode, respectively, to the transmitter and the receiver by means of a coaxial lead, the PIN diodes being controlled via the coaxial lead.

9. An apparatus as claimed in claim 8, wherein the coaxial lead of the transmitter and the receiver is d.c. uncoupled and further comprising means for connecting the coaxial lead to a source of positive or negative potential.

10. A coil arrangement for use in a magnetic resonance imaging apparatus, said arrangement comprising first and second coils for generating and detecting electromagnetic fields, the magnetic fields generated by said first and second coils extending perpendicularly to one another, said first coil having a first supply terminal, said second coil having a second supply terminal, a $\frac{1}{4}\lambda$ lead connecting said first supply terminal to said second supply terminal, a first junction and a second junction, phase shifting means for connecting said first supply terminal to said first junction and for connecting said second supply terminal to said second junction, and electrical connection means connected to said first and second junctions for uncoupling said first junction from said second junction and selectively coupling said first junction or said second junction to ground.

* * * * *